(12) United States Patent
Kuzmenka et al.

(10) Patent No.: US 7,145,377 B2
(45) Date of Patent: Dec. 5, 2006

(54) DEVICE AND METHOD FOR CONVERTING AN INPUT SIGNAL

(75) Inventors: Maksim Kuzmenka, Munich (DE); Konstantin Korotkov, Munich (DE)

(73) Assignee: Infineon Technologies AG, Munich (DE)

( * ) Notice: Subject to any disclaimer, the term of this patent is extended or adjusted under 35 U.S.C. 154(b) by 127 days.

(21) Appl. No.: 10/783,068

(22) Filed: Feb. 20, 2004

(65) Prior Publication Data

US 2004/0189349 A1    Sep. 30, 2004

(30) Foreign Application Priority Data

Mar. 31, 2003   (EP)   ................... 03007255

(51) Int. Cl.
*H03H 11/26*   (2006.01)
(52) U.S. Cl. ..................... 327/407; 327/266
(58) Field of Classification Search ............. 327/52, 327/266, 274, 280, 287, 276–278, 284–285, 327/407
See application file for complete search history.

(56) References Cited

U.S. PATENT DOCUMENTS

| | | | |
|---|---|---|---|
| 3,244,986 A | 4/1966 | Rumble | |
| 3,419,804 A | 12/1968 | Gorog et al. | |
| 4,431,916 A | 2/1984 | Couch | |
| 4,677,388 A * | 6/1987 | Morrison | 327/78 |
| 5,202,678 A | 4/1993 | Taber et al. | |
| 5,589,788 A * | 12/1996 | Goto | 327/276 |
| 5,789,950 A * | 8/1998 | Nakagawa | 327/105 |
| 6,046,611 A | 4/2000 | Morishima | |
| 6,870,415 B1* | 3/2005 | Zhang et al. | 327/274 |
| 2004/0051576 A1* | 3/2004 | Zhang et al. | 327/276 |
| 2004/0130371 A1* | 7/2004 | Roy | 327/261 |

FOREIGN PATENT DOCUMENTS

FR    2644025    7/1990

\* cited by examiner

*Primary Examiner*—My-Trang Nu Ton
(74) *Attorney, Agent, or Firm*—Slater & Matsil, L.L.P.

(57) ABSTRACT

A device for converting an input signal having a bipolar pulse with a positive part and a negative part of same duration, into a difference signal includes a delay member with an input for receiving the input signal and an output. The delay member delays the input signal in order to obtain a delayed signal and outputs the delayed signal to the output. The device further includes a differential amplifier with a first input for receiving the input signal, a second input for receiving the delayed signal, and an output for outputting the difference signal formed from the input signal and the delayed signal.

17 Claims, 3 Drawing Sheets

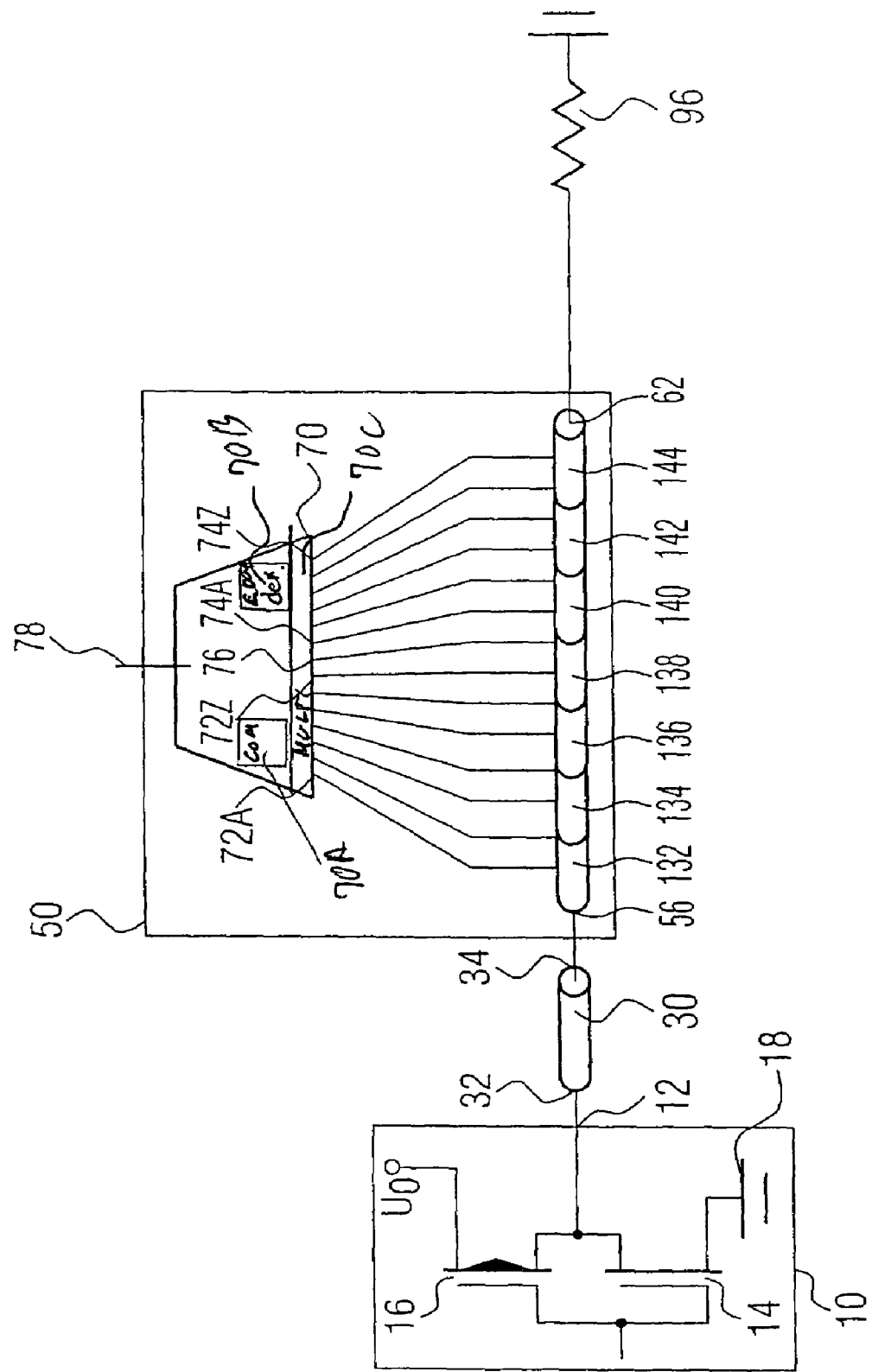

DEVICE AND METHOD FOR CONVERTING AN INPUT SIGNAL

BACKGROUND OF THE INVENTION

1. Field of the Invention

The present invention relates to a device and a method for converting an input signal, with the input signal comprising a bipolar pulse with a positive part and a negative part of same duration which encodes a bit.

2. Description of the Related Art

In almost any field of modern semi-conductor technology, binary signals, or signals encoding information represented in binary form, are transmitted. The so-called single-ended signaling technique provides particularly low requirements as regards circuitry and, therefore, particularly low manufacturing costs. According to the single-ended signaling technique, an electrical signal is transmitted via a single line. A reference potential is preferably transmitted via a second single line. The voltage of the electrical signal against the reference potential encodes (in binary form) the information to be transmitted. The single-ended signaling technique, however, comprises serious disadvantages. Among these are a low signal swing, the necessity of providing an additional synchronization signal, reference voltage or reference current, and insufficient suitability for high transmission rates, or band-widths, and great cable lengths.

Therefore, single-ended signaling technique has so far been restricted to simple applications with small bandwidths and/or short transmission paths. Otherwise, on the side of the receiver, an additional clock or an additional reference signal is necessary for converting the input signal, thus enabling safe decoding. The additional clock or the additional reference signal needs to be provided to the receiver via additional lines and/or an additional network.

SUMMARY OF THE INVENTION

It is the object of the present invention to provide simplified devices and methods for converting an input signal and for transmitting a bit.

The present invention is a device for converting an input signal comprising a bipolar pulse with a positive part and a negative part of same duration into a difference signal. The device includes a delay member with an input for receiving the input signal and an output, for delaying the input signal in order to receive a delayed signal and for outputting the delayed signal at the output. Further, the device includes a differential amplifier having a first input for receiving the input signal, a second input for receiving the delayed signal and an output for outputting the difference signal formed from the input signal and the delayed signal.

The present invention further is a method for converting an input signal comprising a bipolar pulse with a positive part and a negative part of same duration into a difference signal. The method includes delaying the input signal to obtain a delayed signal, forming a difference signal from the input signal and the delayed signal, and outputting the difference signal.

The present invention is based on the idea of delaying an input signal having a bipolar pulse with a positive part and a negative part of same length, or duration, by means of a delay member in order to obtain a delayed signal, with a differential amplifier simultaneously tapping the input signal at the input of the delay member and the delayed signal at the output of the delay member and forming a difference signal from the same. Preferably, the delay of the delay member is selected to be equal to the duration of the positive part and to the duration of the negative part of the bipolar pulse, respectively. The difference signal comprises a maximum (positive) value, if simultaneously the positive part of the bipolar pulse is present in the input signal and the negative part of the bipolar pulse is present in the delayed signal. The difference signal comprises a minimum (negative) value, if simultaneously the negative part of the bipolar pulse is present in the input signal and the positive part of the bipolar pulse is present in the delayed signal.

An advantage of the present invention is that the difference signal comprises double the signal swing as compared to the input signal.

In accordance with one aspect, the present invention is a device for transmitting a bit, the device having a driver for driving an input signal, comprising a bipolar pulse with a positive part and a negative part of same duration and encoding the bit, a transmission line for transmitting the input signal with an input connected to the driver and an output, a device for converting the input signal, as described above, which is connected to the output of the transmission line and which decodes the bit by means of the difference signal, and a termination load connected to the output of the delay member. The termination load is connected to the output of the delay member directly or via a further transmission line.

In accordance with a further aspect, the present invention is a method for converting a bit. The method includes driving an input signal comprising a bipolar pulse with a positive part and a negative part of same duration and encoding the bit; transmitting the input signal; converting the input signal in accordance with the method described above; and decoding the bit by means of the difference signal.

The above aspects of the present invention are further based on the idea of encoding a bit in a bipolar pulse with a positive part and a negative part of same duration. Thus, the bit may be decoded from the bipolar pulse in a more reliable manner. As a result, additional synchronization or reference signals are becoming unnecessary and/or it is possible to accommodate higher transmission rates and/or greater transmission lengths.

In accordance with a preferred embodiment, the delay member consists of two partial delay members connected in series between the input and the output of the delay member. A partially delayed signal is tapped between the partial delay members. The bit will be decoded from the difference signal at the time the partially delayed signal comprises a (rising or falling) edge.

By detecting the edge of the partially delayed signal and using the same for triggering the decoding operation, decoding will be further enhanced and made more reliable. The present invention thus provides a self-latching signal and a self-latching signal processing, using one single line.

BRIEF DESCRIPTION OF THE DRAWINGS

In the following, preferred embodiments of the present invention will be explained with reference to the attached figures, in which:

FIG. 4 shows a schematic circuit diagram of a transmission device in accordance with a second embodiment of the present invention.

DETAILED DESCRIPTION OF THE PREFERRED EMBODIMENTS

Figure 1:
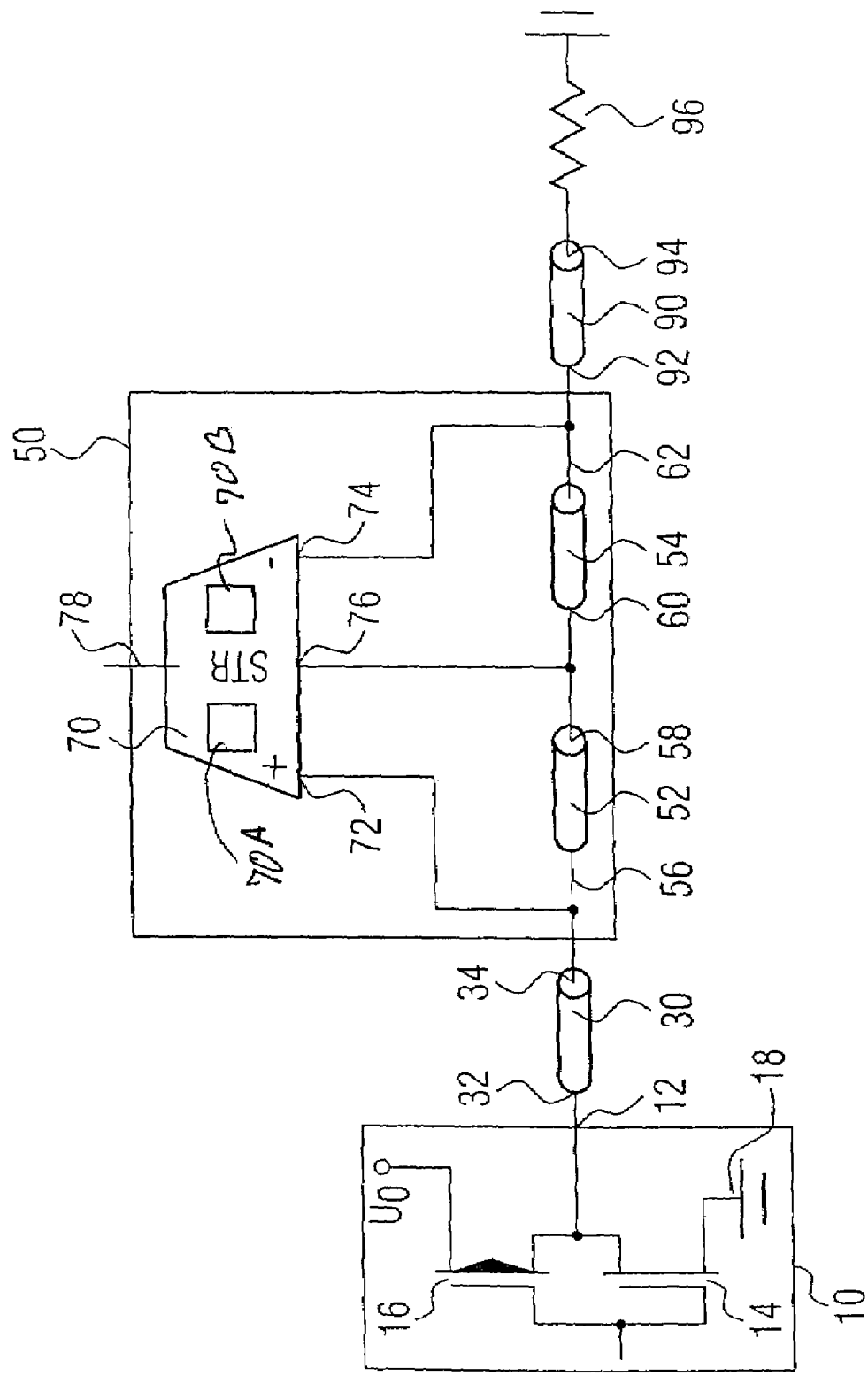
FIG. 1 shows a schematic circuit diagram of a transmission device in accordance with a first embodiment of the present invention.

FIG. 1 is a schematic circuit diagram of a device for transmitting a bit in accordance with a first preferred embodiment of the present invention. A driver 10 generates at its output 12 a signal with a bipolar pulse comprising a positive and a negative part of same duration which pulse encodes a bit. The nature of this bipolar pulse will be explained in more detail herein below by means of FIGS. 2 and 3. In FIG. 1, as constituents of the driver 10, two field effect transistors 14, 16 are illustrated as an example in a strongly simplified form, the channels of which are connected in series between a potential $U_0$ and ground 18. Alternatively, the driver 10 comprises any other structure which is suitable to generate the bipolar pulses illustrated further below by means of FIG. 2 and 3.

The transmission line 30 comprises an input 32, which is connected to the output 12 of the driver 10, and an output 34. The transmission line 30 is any line, for example a simple wire, with the reference potential, or ground, being provided by another line means. Alternatively, the transmission line 30 is a non-twisted or twisted pair, a coaxial cable or any other line.

A device 50 includes a delay circuit or member consisting of a first partial delay member 52 and a second partial delay member 54. An input 56 of the delay member is the input of the first partial delay member 52 and is also connected to the output 34 of the transmission line 30. An output 58 of the first partial delay member 52 is connected to an input 60 of the second partial delay member 54. An output 62 of the second partial delay member 54 is also the output of the delay member. The device 50 further comprises differential amplifier circuitry 70 having a first input (+) 72, a second input (−) 74, a strobe input (str.), or third input 76, and an output 78. The first input 72 of the differential amplifier circuitry 70 is connected to the input 56 of the delay member and to the output 34 of the transmission line 30, the second input 74 of the differential amplifier circuitry 70 is connected to the output 62 of the delay member, and the third input 76 of the differential amplifier circuitry 70 is connected to the output 58 of the first partial delay member 52 and to the input 60 of the second partial delay member 54. The output 78 of the differential amplifier circuitry 70 is also the output of the device 50.

A further transmission line 90 comprises an input 92, which is connected to the output 62 of the delay member of the device 50, and an output 94. The further transmission line 90 may be of the same type as the transmission line 30 or of a different type.

The output 94 of the further transmission line 90 is terminated with a termination load, or termination resistor, 96 which is adapted to the impedance of the transmission lines 30, 90.

Figure 2:
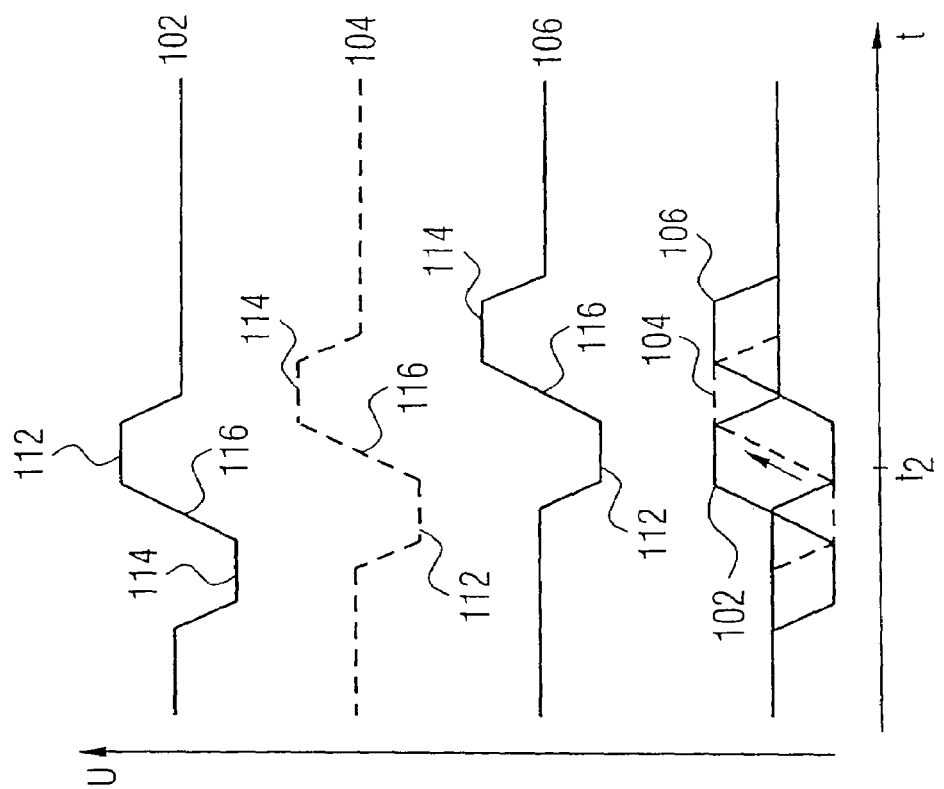
FIGS. 2 and 3 show schematic illustrations of various signals in the first embodiment represented in FIG. 1.
Figure 3:
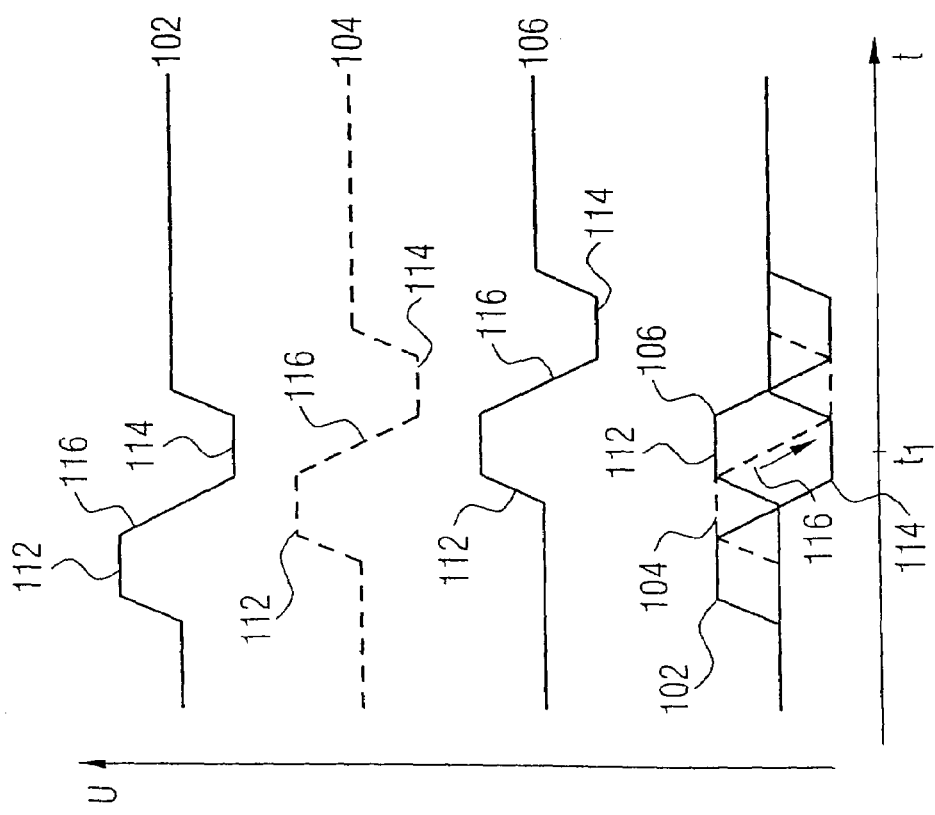

With respect to the mode of operation of the first embodiment of the present invention illustrated in FIG. 1, the following refers to FIGS. 2 and 3. FIGS. 2 and 3 are schematic diagrams representing the time dependencies of the signals applied to the inputs 72, 74, 76 of the differential amplifier 70. In each case, the time t is ascribed to the abscissa, and the time-dependent potentials (U), or levels, of the three signals are ascribed to the ordinate. At the very top in each of FIGS. 2 and 3, an input signal 102 applied to the input 56 of the delay member is represented, which is generated by the driver 10 and transmitted by the transmission line 30 to the input 56 of the delay member. The input signal 102 is at the same time applied to the first input 72 of the differential amplifier circuitry 70. Below input signal 102 there is represented a partially delayed signal 104, which is generated by the first partial delay member 52 from the input signal 102 and is applied to the third input 76 of the differential amplifier circuitry 70. Below the partially delayed signal 104 there is represented a delayed signal 106, which is generated by the second partial delay member 54 from the partially delayed signal 104 and which is applied to the second input 74 of the differential amplifier circuitry 70. In FIGS. 2 and 3, the input signal 102, the partially delayed signal 104 and the delayed signal 106 are each represented with an arbitrary offset along the ordinate in order to avoid any overlaps. At the very bottom in FIGS. 2 and 3 each, the three signals 102, 104, 106 are represented in an overlapped position and with their actual potential differences, respectively.

The input signal 102 represented in FIG. 2 comprises a bipolar pulse with a positive part 112 and a negative part 114. The positive part 112 and the negative part 114 preferably comprise approximately the same length and time duration, respectively. In FIG. 2, the positive part 112 precedes the negative part 114 of the bipolar pulse, whereby, in this example, a logical 1 is encoded. In FIG. 3, the negative part 114 precedes the positive part 112 of the bipolar pulse, whereby a logical 0 is encoded. Between the positive part 112 and the negative part 114, the bipolar pulse of the input signal 102 comprises a rising or falling edge 116.

In the embodiment shown, the delay of the delay member corresponds to the duration of the positive part 112 and to the negative part 114 of the bipolar pulse, respectively. Accordingly, in FIG. 2, the negative part 114 of the bipolar pulse of the input signal 102 coincides, in terms of time, with the positive part 112 of the bipolar pulse in the delayed signal 106. The delay of the first partial delay member 52 and the delay of the second partial delay member 54 each amount to approximately half of the delay of the delay member. Correspondingly, the edge 116 between the positive part 112 and the negative part 114 of the bipolar pulse in the partially delayed signal 104 coincides, in terms of time, with the negative part 114 of the bipolar pulse in the input signal 102 and with the positive part 112 of the bipolar pulse in the delayed signal 106. The coincidence of the negative part 114 of the bipolar pulse in the input signal 102 applied to the first input 72 of the differential amplifier circuitry 70, of the positive part 112 of the bipolar pulse in the delayed signal 106 applied to the second input 74 of the differential amplifier circuitry 70 and of the falling edge 116 of the bipolar pulse in the partially delayed signal 104 applied to the third input 76 of the differential amplifier circuitry 70 at the time $t_1$ is utilized in accordance with the present invention in order to decode a logic 1 from the bipolar pulse with an especially high degree of reliability. It is clearly recognizable that the illustrated coincidence of the three described features in the three signals 102, 104, 106 enables safe decoding of the logical 1 encoded in the bipolar pulse.

In FIG. 3, the negative part 114 precedes the positive part 112 of the bipolar pulse, whereby a logic 0 is encoded. It is clearly recognizable that, at a time $t_2$, the positive part 112 of the bipolar pulse in the input signal 102, the negative part 114 of the bipolar pulse in the delayed signal 106, and a rising edge 116 between the negative part 114 and the positive part 112 of the bipolar pulse in the partially delayed signal 104 coincide, in terms of time. The levels of the signals 102, 104, 106 represented in FIG. 3 at the time $t_2$ comprise a maximum difference from the levels of the signals 102, 106, 104 represented in FIG. 2 at the time $t_1$. The pattern of the signals 102, 104, 106 represented in FIG. 3 thus enables a very clear and especially safe and reliable decoding of the logical 0 from the bipolar pulse.

In accordance with a first variation of the embodiment of the present invention illustrated in FIG. 1, the differential amplifier circuitry 70 forms a difference signal only from the input signal applied at its first input 72 and from the delayed signal applied at its second input 74, which difference signal it outputs at its output 78. A positive difference signal exceeding a predetermined positive threshold indicates that the input signal comprises a bipolar pulse, which encodes a logical 0, as represented in FIG. 3. A difference signal falling below a predetermined negative threshold indicates that a bipolar pulse is present, which encodes a logical 1, as represented in FIG. 2. The difference signal output at the output 78 of the differential amplifier circuitry 70 may be interpreted correspondingly by a downstream circuit, which is not represented in FIG. 1, in order to decode a logical 0 and a logical 1, respectively. Alternatively, differential amplifier circuitry 70 may include comparator circuit 70a, which compares the difference signal to the predetermined positive and predetermined negative threshold already in the differential amplifier circuitry 70, and, already at its output 78, the differential amplifier 70 outputs a signal, which represents the decoded logical 0 and logical 1, respectively. The subdivision of the delay member in the partial delay members 52, 54 in addition to the third input 76 of the differential amplifier are not required with this variation and may be omitted.

In accordance with a second variation of the embodiment illustrated in FIG. 1, the differential amplifier circuitry 70 additionally detects the partially delayed signal 104 applied at its third input 76 and outputs, at its output 78, a logical 0, only if the difference signal exceeds the predetermined positive threshold and, at the same time, the partially delayed signal 104 comprises a rising edge, and outputs a logical 1, only if the difference signal falls below the predetermined negative threshold and, at the same time, the partially delayed signal 104 comprises a negative edge 116. Alternatively, the differential amplifier circuitry 70 outputs at its output 78 one or more output signals in series or in parallel, which indicate whether the difference signal exceeds the predetermined positive threshold or falls below the predetermined negative threshold and whether the partially delayed signal 104 comprises a positive or a negative edge 116.

FIGS. 2 and 3 illustrate the case where the delay of each partial delay member 52, 54 amounts to approximately half of the duration of the positive part 112 and of the negative part 114 of the bipolar pulse. It may be recognized that a decoding of the bipolar pulse is also possible with the device 50 shown in FIG. 1, if the duration of the positive part 112 and the duration of the negative part 114 is greater than the total delay of the two partial delay members 52, 54 together, and, if necessary, also if the duration of the positive part 112 and of the negative part 114 deviate from each other as long as the edge 116 between the positive part 112 and the negative part 114 is steep enough. The device 50 illustrated in FIG. 1, however, may no longer safely decode the bipolar pulse, if the duration of the positive part 112 and of the negative part 114 of the bipolar pulse are more than only slightly shorter than the delay of the delay member.

In FIG. 4, a second embodiment of the present invention is represented, which differs from the first embodiment represented by means of FIG. 1 only in that the delay member consists of a plurality of delay members 132, ..., 144, which are connected in series, and in that the differential amplifier circuitry 70 comprises a plurality of first inputs 72a, ..., 72z and a plurality of second inputs 74a, ..., 74z. The first inputs 72a, ..., 72z and the second inputs 74a, ..., 74z of the differential amplifier circuitry 70 are connected to various points, or taps, within the chain of delay members 132, ..., 144, in order to tap different signals which are partially delayed by delay times different from each other. The differential amplifier circuitry 70 is implemented such that, for a finite discrete amount of durations of the positive parts 112 and of the negative parts 114 or for durations of the positive parts 112 and of the negative parts 114 within one or several value intervals, it selects an adapted first input 72a, ..., 72z and an adapted second input 74a, ..., 74z each, such that the total delay between the signal applied to the selected first input 72a, ..., 72z and the input applied to the selected second input 74a, ..., 74z corresponds at least approximately to the duration of the positive part 112 and of the negative part 114 of a bipolar pulse of an input signal applied to the input 56 of the delay member. By means of an asymmetric selection of the first input 72a, ..., 72z and of the second input 74a, ..., 74z it can be accounted for an asymmetry of a bipolar pulse, which expresses itself in different durations of the positive part 112 and of the negative part 114. The selection of the first input 72a, ..., 72z and of the second input 74a, ..., 74z is effected either automatically by the differential amplifier circuitry 70 or it is specified from outside by another device or by a person operating the device 50. Alternatively, also the strobe input, or third input, 76 of the differential amplifier circuitry 70 is selected according to the bit rate, or to the data transmission rate, or to the duration of the positive part 112 and of the negative part 114 of the bipolar pulse.

At very high frequencies (for example more than 5 GHz) the dimensions of the delay members and of corresponding delay lines, respectively, become comparable to the dimensions of a typical silicon chip. In this case, the realization of the present invention becomes especially simple, especially when the delay lines are paced directly on or very close to the chip.

The above embodiments were described for a case, where a bipolar pulse, whose negative part 114 follows the positive part 112, encodes a logical 1. Likewise, the present invention may be implemented in case a bipolar pulse with a positive part 112, which follows a negative part 114, encodes a logical 1. Furthermore, deviating from FIGS. 1 and 4, several devices 50 may be connected by transmission lines, arranged in series between the driver 10 and the termination load 96. Furthermore, the present invention may be implemented both as a device and also as a method.

While this invention has been described in terms of several preferred embodiments, there are alternations, permutations, and equivalents which fall within the scope of this invention. It should also be noted that there are alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for converting an input signal comprising a bipolar pulse with a positive part and a negative part of same duration into a difference signal, comprising:
   a delay member with an input for receiving the input signal and an output, for delaying the input signal to obtain a delayed signal and for outputting the delayed signal at an output;
   a differential amplifier with a first input for receiving the input signal, a second input for receiving the delayed signal and an output for outputting the difference signal formed from the input signal and the delayed signal;
   wherein the delay member includes a first partial delay member with an input for receiving the input signal and an output for outputting a partially delayed signal and a second partial delay member with an input for receiving the partially delayed signal and an output for outputting the delayed signal;
   wherein the differential amplifier further comprises an edge detector for detecting an edge of the partially delayed signal and a comparator for determining whether the difference signal is greater than a first predetermined threshold, for determining whether the difference signal is smaller than a second predetermined threshold; and
   wherein the differential amplifier is implemented to output a binary signal depending on whether the difference signal is greater than the first predetermined threshold and the partially delayed signal comprises a rising edge or whether the partially delayed signal is smaller than the second predetermined threshold end the partially delayed signal comprises a falling edge.

2. The device in accordance with claim 1,
   wherein the delay member comprises a plurality of partial delay members, which are connected in series between the input and the output of the delay member, to generate several varyingly strong delayed signals, and
   wherein the differential amplifier comprises a plurality of first inputs for receiving a plurality of first input signals and a plurality of second inputs for receiving a plurality of second input signals and wherein the differential amplifier is implemented to select one of the plurality of first input signals to be the first input signal and to select one of the plurality of second input signals to be the second input signal.

3. The device in accordance with claim 2, wherein the differential amplifier is implemented to select one of the plurality of first input signals to be the input signal and to select one of the plurality of second input signals to be the second input signal depending on the duration of the positive part and of the negative part of the bipolar pulse of the input signal.

4. A device for transmitting a bit, comprising:
   a driver for driving the input signal comprising a pulse with a positive part and a negative part of same duration which encodes the bit;
   a transmission line for transmitting the input signal with an input, which is connected to the driver, and an output;
   a device for convening the input signal into a difference signal, the device comprising a delay member with an input for receiving the input signal and an output, for delaying the input signal to obtain a delayed signal and for outputting the delayed signal at an output, and a differential amplifier with a first input for receiving the input signal, a second input for receiving the delayed signal and an output for outputting the difference signal formed from the input signal and the delayed signal; and
   a termination load, which is connected to the output of the delay member.

5. The device in accordance with claim 4, wherein the termination load is connected to the output of the delay member via a further transmission line.

6. The device of claim 4 further comprising a reference potential, said reference potential connected to said driver and to said termination load and said positive part of said input signal being positive with respect to said reference signal and said negative part of said input signal being negative with respect to said reference signal.

7. The device of claim 6 wherein said reference potential is ground.

8. A method for converting an input signal, comprising a bipolar pulse with a positive part and a negative part of same duration, into a difference signal, comprising:
   delaying the input signal to obtain a delayed signal;
   forming a difference signal from the input signal and the delayed signal;
   generating a partially delayed from the input signal, wherein the delay of the partially delayed signal as against the input signal is less than the delay of the delayed signal as against the input signal;
   detecting an edge of the partially delayed signal;
   determining whether the difference signal is greater than a first predetermined threshold or smaller than a second predetermined threshold; and
   outputting a binary signal depending on whether the difference signal is greater than the first predetermined threshold and the partially delayed signal comprises a rising edge or whether the difference signal is smaller than the second predetermined threshold and the partially delayed signal comprises a falling edge.

9. The method in accordance with claim 8, further comprising:
   generating a plurality of varyingly strong delayed signals; and
   selecting of two of the plurality of varyingly strong delayed signals depending on the duration of the positive part and of the negative part of the bipolar pulse to obtain a first selected signal and a second selected signal.

10. A method for transmitting a bit, comprising:
    driving an input signal comprising a pulse with a positive part and a negative part of same duration which encodes the bit;
    transmitting the input signal;
    converting the input signal into a difference signal, by delaying the input signal to obtain a delayed signal, and forming a difference signal from the input signal and the delayed signal; and
    decoding the bit by means of the difference signal.

11. The method of claim 10 further comprising connecting a reference potential such that said positive part of said input signal is greater than said reference signal and said negative part of said input signal is less than said reference signal.

12. The method of claim 11 wherein said reference potential is ground.

13. A device for converting an input signal comprising a bipolar pulse with a positive part and a negative part of same duration into a difference signal, comprising:

a plurality of partial delay members, which are connected in series between the input and the output of the delay member, to generate several varyingly strong delayed signals;

a differential amplifier with a first input for receiving the input signal, a second input for receiving the delayed signal and an output for outputting the difference signal formed from the input signal and the delayed signal;

wherein the differential amplifier comprises a plurality of first inputs for receiving a plurality of first input signals and a plurality of second inputs for receiving a plurality of second inputs signals and wherein the differential amplifier is implemented to select one of the plurality of first input signals to be the first input signal and to select one of the plurality of second input signals to be the second input signal; and wherein the differential amplifier is implemented to select one of the plurality of first input signals to be the input signal and to select one of the plurality of second input signals to be the second input signal depending on the duration of the positive part and of the negative part of the bipolar pulse of the input signal.

14. A method for converting an input signal, comprising a bipolar pulse with a positive part and a negative part of same duration, into a difference signal, comprising:

generating a plurality of varyingly strong delayed signals;

selecting of two of the plurality of varyingly strong delayed signals depending on the duration of the positive part and of the negative part of the bipolar pulse to obtain a first selected signal and a second selected signal; and forming a difference signal from the input signal and the delayed signal.

15. A device for converting an input signal comprising a bipolar pulse with a positive part and a negative part having the same duration into a binary signal, comprising:

delay circuitry comprising a first delay member having an input for receiving the input signal and an output for outputting a partially delayed signal, and a second delay member having an input for receiving the partially delayed signal and an output for outputting a delayed signal; and differential amplifier circuitry comprising a first input for receiving the input signal, a second input for receiving the partially delayed signal, a third input for receiving the delayed signal, and an output for outputting a difference signal formed from the input signal and the delayed signal, said differential amplifier circuitry further comprising, edge detector circuitry for determining if said edge of the partially delayed signal is rising or falling, and a comparator circuitry, said edge detector circuitry and comparator circuitry operating to output a binary signal depending on whether the difference signal is greater than a first predetermined threshold and the partially delayed signal comprises a rising edge, or whether the difference signal is smaller than a second predetermined threshold and the partially delayed signal comprises a falling edge.

16. The device of claim 15 wherein the delay circuitry comprises a plurality of partial delay members, which are connected in series between the input and the output of the delay member, to generate several varyingly strong delayed signals, and wherein the differential amplifier comprises a plurality of first inputs far receiving a plurality of first input signals and a plurality of second inputs for receiving a plurality of second input signals and wherein the differential amplifier is implemented to select one of the plurality of first input signals to be the first input signal and to select one of the plurality of second input signals to be the second input signal.

17. The device of claim 16 wherein the differential amplifier circuitry is implemented to select one of the plurality of first input signals to be the input signal and to select one of the plurality of second input signals to be the second input signal depending on the duration of the positive part and of the negative part of the bipolar pulse of the input signal.

* * * * *